(12) United States Patent
Eom

(10) Patent No.: US 11,916,177 B2
(45) Date of Patent: Feb. 27, 2024

(54) ILLUMINATION DEVICE HAVING A FIRST PHOSPHOR LAYER AND SECOND PHOSPHOR LAYER

(71) Applicant: LG INNOTEK CO., LTD., Seoul (KR)

(72) Inventor: Dong Il Eom, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 247 days.

(21) Appl. No.: 17/049,127

(22) PCT Filed: Apr. 25, 2019

(86) PCT No.: PCT/KR2019/004984
§ 371 (c)(1),
(2) Date: Oct. 20, 2020

(87) PCT Pub. No.: WO2019/212194
PCT Pub. Date: Nov. 7, 2019

(65) Prior Publication Data
US 2021/0242376 A1 Aug. 5, 2021

(30) Foreign Application Priority Data

May 4, 2018 (KR) .......... 10-2018-0051766

(51) Int. Cl.
*H01L 33/50* (2010.01)
*H01L 25/075* (2006.01)
*H01L 33/60* (2010.01)

(52) U.S. Cl.
CPC ........ *H01L 33/507* (2013.01); *H01L 25/0753* (2013.01); *H01L 33/505* (2013.01);
(Continued)

(58) Field of Classification Search
CPC . H01L 33/504; H01L 33/507; H01L 25/0753; H01L 33/508; H01L 33/505; H01L 33/60
(Continued)

(56) References Cited

U.S. PATENT DOCUMENTS

| 7,474,050 B2 | 1/2009 | Kaneda et al. |
| 9,865,577 B2 | 1/2018 | Bibl et al. |

(Continued)

FOREIGN PATENT DOCUMENTS

| CN | 102856312 A | 1/2013 |
| CN | 106949419 A | 7/2017 |

(Continued)

OTHER PUBLICATIONS

International Search Report dated Aug. 2, 2019 issued in Application No. PCT/KR2019/004984.

(Continued)

*Primary Examiner* — David Chen
(74) *Attorney, Agent, or Firm* — KED & Associates LLP

(57) ABSTRACT

An illumination device disclosed in an embodiment of the invention includes a substrate, a plurality of light emitting elements disposed on the substrate, a resin layer disposed on the plurality of light emitting elements, a first phosphor layer disposed on an upper surface of the resin layer, and a plurality of second phosphor layers disposed on side surfaces of the resin layer, and a first light blocking layer disposed between the first phosphor layer and the second phosphor layer. The first phosphor layer and the second phosphor layer may have different colors.

15 Claims, 8 Drawing Sheets

(52) U.S. Cl.
CPC ............ *H01L 33/60* (2013.01); *H01L 33/501* (2013.01); *H01L 33/502* (2013.01)

(58) Field of Classification Search
USPC ....... 257/89, 98, 99, 100, E33.056, E33.059, 257/E33.061; 438/26, 28, 29
See application file for complete search history.

(56) References Cited

U.S. PATENT DOCUMENTS

| | | | |
|---|---|---|---|
| 10,043,952 | B2 | 8/2018 | Vampola et al. |
| 10,081,295 | B2 | 9/2018 | Dellock et al. |
| 2004/0155578 | A1* | 8/2004 | Ito ................ H10K 71/231 313/506 |
| 2008/0303410 | A1* | 12/2008 | Kaneda ................ H01L 33/60 313/503 |
| 2010/0068446 | A1 | 3/2010 | McGuire |
| 2011/0128466 | A1 | 6/2011 | Ishii et al. |
| 2011/0180830 | A1* | 7/2011 | Hwang ................ H01L 33/54 257/E33.059 |
| 2011/0279754 | A1 | 11/2011 | Park et al. |
| 2011/0297981 | A1 | 12/2011 | Liao et al. |
| 2012/0299463 | A1 | 11/2012 | Kume |
| 2013/0093362 | A1* | 4/2013 | Edwards ................ F21S 4/28 359/326 |
| 2013/0100692 | A1 | 4/2013 | Yokobayashi |
| 2013/0270592 | A1* | 10/2013 | Reiherzer ............... H01L 33/52 257/98 |
| 2013/0320380 | A1* | 12/2013 | Kanemaru ............. H01L 33/60 438/27 |
| 2014/0367633 | A1 | 12/2014 | Bibl et al. |
| 2015/0131280 | A1* | 5/2015 | Harbers ................ F21V 13/08 362/235 |
| 2015/0263243 | A1 | 9/2015 | Nakagawa et al. |
| 2016/0351757 | A1* | 12/2016 | Yoshimura ............. H01L 33/56 |
| 2017/0101047 | A1 | 4/2017 | Dellock et al. |
| 2017/0167686 | A1 | 6/2017 | Kang |
| 2019/0245120 | A1 | 8/2019 | Choi et al. |

FOREIGN PATENT DOCUMENTS

| | | | | |
|---|---|---|---|---|
| EP | 1780805 | | 5/2007 | |
| JP | 2003-217521 | | 7/2003 | |
| JP | 2006-148051 | A | 6/2006 | |
| JP | 2007-035885 | A | 2/2007 | |
| JP | 2007035885 | A * | 2/2007 | |
| JP | 2007157943 | A * | 6/2007 | ............... F21V 3/02 |
| JP | 2009-087681 | A | 4/2009 | |
| JP | 2009-094351 | A | 4/2009 | |
| JP | 2012-248553 | A | 12/2012 | |
| JP | 2013-105826 | A | 5/2013 | |
| JP | 2013-183057 | A | 9/2013 | |
| JP | 2015-511773 | A | 4/2015 | |
| JP | 2015-176960 | A | 10/2015 | |
| JP | 2016-523450 | A | 8/2016 | |
| KR | 10-2010-0068446 | | 6/2010 | |
| KR | 10-2011-0018391 | | 2/2011 | |
| KR | 10-2011-0125518 | | 11/2011 | |
| KR | 10-2011-0132988 | | 12/2011 | |
| KR | 10-2013-0043077 | | 4/2013 | |
| KR | 10-2016-0080945 | | 7/2016 | |
| KR | 10-2017-0071154 | | 6/2017 | |
| KR | 10-2018-0028822 | | 3/2018 | |
| WO | WO 2012/121304 | | 9/2012 | |
| WO | WO 2013/097736 | | 7/2013 | |
| WO | WO-2013102861 | A1 * | 7/2013 | ............... F21V 7/22 |

OTHER PUBLICATIONS

European Search Report dated Jan. 5, 2022 issued in Application No. 19796705.2.
Korean Office Action dated Nov. 18, 2022 issued in Application 10-2018-0051766.
Japanese Office Action dated Feb. 21, 2023 issued in Application 2020-560301.
Chinese Office Action dated Mar. 11, 2023 issued in Application 201980030245.X.

* cited by examiner

ILLUMINATION DEVICE HAVING A FIRST PHOSPHOR LAYER AND SECOND PHOSPHOR LAYER

CROSS-REFERENCE TO RELATED PATENT APPLICATIONS

This application is a U.S. National Stage Application under 35 U.S.C. § 371 of PCT Application No. PCT/KR2019/004984, filed Apr. 25, 2019, which claims priority to Korean Patent Application No. 10-2018-0051766, filed May 4, 2018, whose entire disclosures are hereby incorporated by reference.

TECHNICAL FIELD

An embodiment of the invention relates to an illumination module or illumination device capable of multi-color light emission.

BACKGROUND ART

In general, a light emitting device, for example, a light emitting diode (LED) has advantages such as low power consumption, semi-permanent life, fast response speed, safety, and environmental friendliness compared to conventional light sources such as fluorescent lamps and incandescent lamps. Such the light emitting diode are applied to various display devices, various illumination devices such as indoor or outdoor lights.

Recently, a lamp employing an LED has been proposed as a vehicle light source. Compared to incandescent lamps, and LED has an advantage in lower power consumption. Since the light emitting device is small, it is possible to increase the design freedom of the lamp, and it has economic efficiency due to the semi-permanent life time. Conventional vehicle illumination devices include a light emitting device and a phosphor surrounding the light emitting device. The phosphor converts light emitted from the light emitting device into a specific color to emit light. However, illumination devices used in vehicles, such as lamps arranged at the front and rear of the vehicle, require a lamp structure that expresses various colors for functional addition or aesthetic effect, but there is a problem that the light emitting surface does not satisfy this demand due to the nature of the conventional lighting device implemented in the same color.

DISCLOSURE

Technical Problem

An embodiment of the invention may provide an illumination module having light emitting surfaces of different colors. An embodiment of the invention may provide an illumination module and an illumination device in which light of a light emitting device is emitted through light emitting surfaces of different colors. An embodiment of the invention may provide an illumination module and an illumination device in which a light emitting region and a blocking region of light emitted from a light emitting device are separated by disposing a light blocking layer between light emitting surfaces of different colors.

Technical Solution

An illumination device according to an embodiment of the invention includes a substrate, a plurality of light emitting devices disposed on the substrate, a resin layer disposed on the plurality of light emitting devices, a first phosphor layer disposed on an upper surface of the resin layer, and a plurality of second phosphor layers disposed on side surfaces of the resin layer, and a light blocking layer disposed between the first phosphor layer and the second phosphor layer, wherein the first phosphor layer and the second phosphor layer may have different colors.

According to an embodiment of the invention, the light blocking layer may be disposed on a side surface of the first phosphor layer and an upper surface of the second phosphor layer. A width of the light blocking layer may be the same as a width of the second phosphor layer, and a thickness of the light blocking layer may be the same as a thickness of the first phosphor layer. The width of the light blocking layer is greater than a width of the second phosphor layer, the thickness of the light blocking layer corresponds to the thickness of the first phosphor layer, and a lower portion of the light blocking layer may overlap the resin layer in a vertical direction.

According to an embodiment of the invention, the width of the light blocking layer is greater than the width of the second phosphor layer, the thickness of the light blocking layer is thicker than the thickness of the first phosphor layer, and the light blocking layer may overlap the resin layer in a vertical direction and a horizontal direction.

According to an embodiment of the invention, the light blocking layer may be disposed on a lower surface of the first phosphor layer and an upper surface of the second phosphor layer, and the light blocking layer may overlap the resin layer in a left-right direction. The first phosphor layer includes a first region disposed on the resin layer, and a second region bent downward from the first region and disposed on a side surface of the resin layer, and the light blocking layer may be disposed on a lower surface of the second region and an upper surface of the second phosphor layer. According to an embodiment of the invention, the light blocking layer may be disposed on a side surface of the first phosphor layer and an inner side surface of the second phosphor layer, and the light blocking layer may overlap the resin layer in a vertical direction. The light blocking layer may be disposed on a side surface of the first phosphor layer and an upper surface of the second phosphor layer.

According to an embodiment of the invention, the light blocking layer may include: a first light blocking portion disposed on a side surface of the first phosphor layer and an upper surface of the second phosphor layer; and a plurality of second light blocking portions disposed between side surfaces of the second phosphor layers, wherein the second light blocking portion extends in a direction of the substrate from the first light blocking portion through between the second phosphor layers. The first light blocking portion and the plurality of second light blocking portions are connected to each other, and a lower surface of the second light blocking portion may contact the substrate.

According to an embodiment of the invention, a reflective layer disposed between the substrate and the resin layer is included, a lower surface of the second light blocking portion is disposed higher than a lower surface of the reflective layer, and the first light blocking portion overlaps with the first phosphor layer in the horizontal direction, and the second light blocking portion may contact the second phosphor layer disposed on each side surface of the resin layer at each corner of the resin layer. The second phosphor layers may include different colors, and the plurality of second phosphor layers may include a number corresponding to a side surface of the resin layer. The first light blocking portion and the second light blocking portions may include a silicon material that reflects or/and absorbs light.

An illumination device according to an embodiment of the invention includes a substrate, a plurality of light emitting devices disposed on the substrate, a resin layer disposed on the light emitting device, a first phosphor layer disposed on the resin layer, and the resin a second phosphor layer disposed on a side of the layer, and a light blocking layer is disposed between the first phosphor layer and the second phosphor layer, wherein at least a part of the light blocking layer may overlap the second phosphor layer in a vertical direction and at least a part of the light blocking layer may overlap may overlap the first phosphor layer in a horizontal direction. According to an embodiment of the invention, the second phosphor layer may be disposed to surround the resin layer. The second phosphor layer may be disposed on the substrate.

Advantageous Effects

According to an embodiment of the invention, light of various colors may be realized by forming phosphor layers that emit light of different colors to a light emitting surface. According to an embodiment of the invention, a light blocking layer is formed between phosphor layers emitting light of different colors, thereby preventing colors mixed by different colors from being displayed to the outside. According to an embodiment of the invention, the light blocking layer is increased a contact region with the phosphor layer and the resin layer, thereby preventing the light blocking layer from being separated from the outside. According to an embodiment of the invention, the light blocking layer is formed by a printing technique, thereby remarkably reducing the thickness thereof, and securing a light emitting region emitted from a phosphor more widely. According to an embodiment of the invention, the light blocking layer is formed by a printing technique, thereby improving adhesive force and simplifying a process.

BEST MODE

Hereinafter, the embodiments will be apparent through the description of the accompanying drawings and embodiments. In the description of the embodiments, each layer (film), region, pattern or structure is formed "on" or "under" of the substrate, each layer (film), region, pad or patterns. In the case described as, "on" and "under" include both "directly" or "indirectly" formed through another layer. In addition, the criteria for the top or bottom of each layer will be described based on the drawings.

Hereinafter, the illumination device according to the embodiment of the invention is described in detail with reference to the attached drawing. The light emitting device of the illumination device may include a light emitting device which emits light of ultraviolet rays, infrared rays, or visible light. The invention relates to a semiconductor device based on a case where a light emitting device is applied as an example of a semiconductor device, and includes a sensing device such as a non-emitting device, for example, a monitoring device of a wavelength or heat, or a device such as a Zener diode, in a package or a light source device to which the light emitting device is applied. The invention provides an example of a semiconductor device based on the case where a light emitting device is applied, and provides a detailed description of an illumination device including a light emitting device. The illumination device according to the invention can be applied to various lamp devices required for lighting, such as a lamp for a vehicle, a lighting device for a mobile container, a home lighting device, and an industrial lighting device. For example, when applied to a vehicle lamp, it can be applied to a head lamp, a position lamp, a side mirror lamp, a fog lamp, a tail lamp, a brake lamp, an auxiliary brake lamp, a direction indicator lamp, a side lamp, a daytime driving lamp, a vehicle indoor lamp, a door scar, a rear combination lamp, a backup lamp, a room lamp, a dashboard lamp, etc. The illumination device of the invention can be applied to indoor and outdoor advertisement devices, display devices, mobile devices, and various kinds of electric cars. In addition, the illumination device can be applied to all lighting related fields or advertisement related fields which are currently developed and commercialized or can be implemented in accordance with future technological development.

Figure 1:
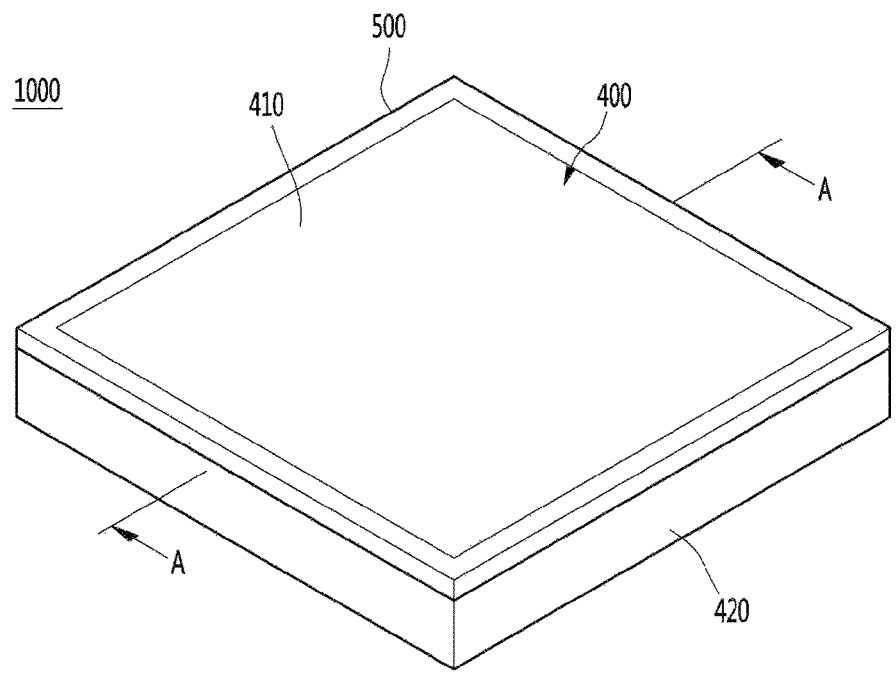
FIG. 1 is a perspective view showing an illumination device according to a first embodiment of the invention.
Figure 2:
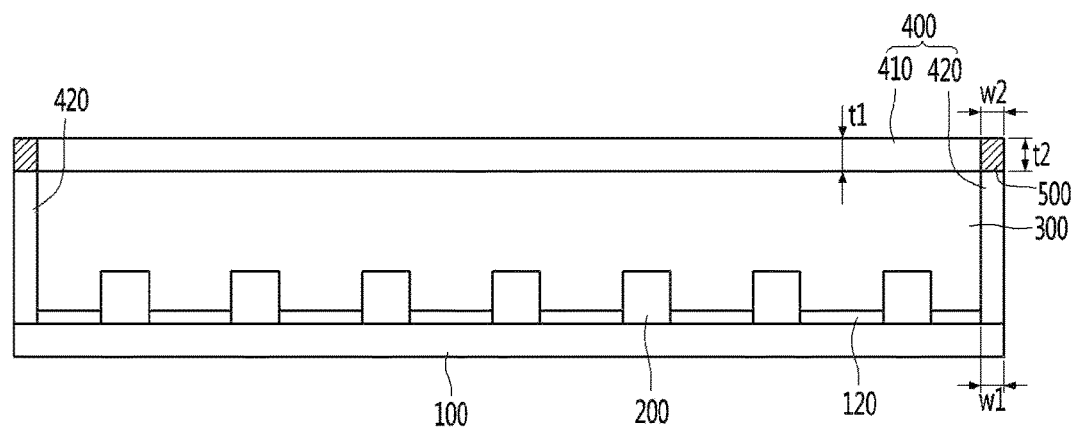
FIG. 2 is a cross-sectional view of A-A side of the illumination device of FIG. 1.

FIG. 1 is a perspective view showing an illumination device according to a first embodiment of the invention, FIG. 2 is a cross-sectional view of an A-A side of FIG. 1, and FIGS. 3 to 10 are cross-sectional views showing various modified examples of the illumination device according to the first embodiment.

The illumination device according to an embodiment of the invention may emit at least two or more colors to the outside. For example, the first color may be emitted to the upper portion of the illumination device, and the second color may be emitted to the upper surface or/and side surface of the illumination device. To this end, in the illumination device of the embodiment, phosphor layers that emit light of different colors may be disposed on the emission surface.

Referring to FIGS. 1 and 2, the illumination device according to an embodiment of the invention may include a light emitting device 200 disposed on a substrate 100, a resin layer 300 disposed on the light emitting device 100, and a first phosphor layer 410 disposed on an upper surface of the resin layer 300 and a second phosphor layer 420 disposed on a side surface of the resin layer.

The substrate 100 may include a printed circuit board (PCB). For example, the substrate 100 may include a resin-based printed circuit board (PCB), a metal core PCB, a flexible PCB, a ceramic PCB, or an FR-4 substrate. The substrate 100 may be a flexible or non-flexible material. The substrate 100 may include an insulating or conductive material. The substrate 100 may be formed of a rigid or flexible material. The substrate 100 may be formed of a transparent or opaque material. The substrate 100 may have electrodes of a conductive pattern formed thereon. The substrate 100 may be designed in various ways according to the purpose of use.

The light emitting device 200 may be implemented as an LED chip. As another example, the light emitting device 200 may be implemented as a package in which an LED chip is disposed in a body, for example, a top view type package. When the light emitting device 200 is implemented as an LED chip, the LED chip may emit light through an upper surface and a plurality of side surfaces. The light emitting device 200 may emit at least one or two or more of blue, green, red, white, infrared, or ultraviolet light. The light emitting device 200 may emit blue light. The light emitting device 200 may emit blue light in a range of, for example, 420 nm to 470 nm. The light emitting device 200 may be provided as a compound semiconductor. The light emitting device 200 may include, for example, a compound semiconductor of group II-VI elements or group III-V elements. For example, the light emitting device 200 may provide by including at least two or more elements selected from aluminum (Al), gallium (Ga), indium (In), phosphorus (P), arsenic (As), and nitrogen (N). The light emitting device 200 may include a first conductivity type semiconductor layer, an active layer, and a second conductivity type semiconductor layer. The first and second conductivity type semiconductor layers may be implemented with at least one of compound semiconductors of group III-V elements or a group II-VI elements. The first and second conductivity type semiconductor layers may be formed of, for example, a semiconductor material having a composition formula of $In_xAl_yGa_{1-x-y}N$ ($0 \leq x \leq 1$, $0 \leq y \leq 1$, $0 \leq x+y \leq 1$). For example, the first and second conductivity type semiconductor layers may include at least one selected from the group including GaN, AlN, AlGaN, InGaN, InN, InAlGaN, AlInN, AlGaAs, GaP, GaAs, GaAsP, AlGaInP, etc. The first conductivity type semiconductor layer may be an n-type semiconductor layer doped with an n-type dopant such as Si, Ge, Sn, Se, and Te. The second conductivity type semiconductor layer may be a p-type semiconductor layer doped with a p-type dopant such as Mg, Zn, Ca, Sr, or Ba. The active layer may be implemented as a compound semiconductor. The active layer may be implemented as at least one of compound semiconductors of group III-V elements or a group II-VI elements. When the active layer is implemented in a multi-well structure, the active layer may include a plurality of well layers and a plurality of barrier layers alternately disposed, and may disposed of a semiconductor material having a composition formula of $In_xAl_yGa_{1-x-y}N$ ($0 \leq x \leq 1$, $0 \leq y \leq 1$, $0 \leq x+y \leq 1$). For example, the active layer may include at least one selected from the group including InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, and InP/GaAs. The light emitting devices 200 may be arranged in at least one row or/and at least one column on the substrate 100, or may be arranged in at least two rows and two or more columns.

A reflective layer 120 may be disposed on an upper portion of the substrate 100. The reflective layer 120 serves to guide the light generated by the light emitting device 200 upward. The reflective layer 120 may include a white material. The reflective layer 120 may include a resin material. The reflective layer 120 may include a resin material such as silicone or epoxy. The material of the reflective layer 120 may include a reflective material such as TiO2. The reflective layer 120 may be a protective layer disposed on an upper surface of the substrate 100, and the protective layer may be formed of a resist material. The resist material may be a solder resist material. The reflective layer 120 may include a protective layer and/or a reflective film. The reflective layer 120 may be disposed between the substrate 100 and the resin layer 300. The reflective layer 120 may be adhered between the substrate 100 and the resin layer 300.

The resin layer 300 is disposed on the substrate 100 and may seal the light emitting devices 200. The resin layer 300 may be formed to be a thickness thicker than a thickness of the light emitting device 200. The resin layer 300 may be disposed higher than the upper surface of the light emitting device 200. The upper portion of the resin layer 300 may be disposed between the upper surface of the light emitting device 200 and the upper surface of the resin layer 300. The resin layer 300 may be a transparent resin material, for example, a resin material such as UV (Ultra violet) resin, silicone, or epoxy. The UV resin may be, for example, may use as a main material a resin (oligomer type) having urethane acrylate oligomer as a main raw material. For example, urethane acrylate oligomer, which is a synthetic oligomer, may be used. The main material may further include a monomer in which isobornyl acrylate (IBOA), hydroxybutyl acrylate (HBA), and hydroxy metaethyl acrylate (HEMA), which are low boiling point diluent type reactive monomers, are mixed, and as an additive, a photoinitiator (for example, 1-hydroxycyclohexyl phenyl-ketone, Diphenyl), Diphenyl (2,4,6-trimethylbenzoyl phosphine oxide), an antioxidant or the like may be mixed. The UV resin may be formed of a composition including 10 to 21% of an oligomer, 30 to 63% of a monomer, and 1.5 to 6% of an additive. In this case, the monomer may be a mixture of 10 to 21% of isobornyl acrylate (IBOA), 10 to 21% of hydroxybutyl acrylate (HBA), and 10 to 21% of hydroxy metaethyl acrylate (HEMA). The additive may be added in an amount of 1 to 5% of a photo initiator to be able to perform a function of initiating photo reactivity, and may be formed of a mixture capable of improving yellowing by adding 0.5 to 1% of an antioxidant. The formation of the resin layer using the above-described composition may form a layer with a resin such as UV resin instead of a light guide plate to adjust the refractive index and the thickness, and simultaneously, may satisfy all of adhesive characteristics, reliability and a mass production rate by using the above-described composition.

The resin layer 300 may further include a beads or diffusion agent therein. The diffusion agent may have a spherical shape, and its size may range from 4 μm to 6 μm. The shape and size of the diffusion agent are not limited thereto. The resin layer 300 may be formed as a single layer, or may be formed in a multilayer structure of two or more layers. In a multilayer structure, the resin layer 300 may include a first resin layer that does not contain impurities, and a second resin layer that includes a diffusion material on the first resin layer. As another example, the second resin layer having the diffusion material may be disposed on the upper surface or/and the lower surface of the first resin layer without impurities.

The resin layer 300 may include an upper surface and a plurality of side surfaces. The plurality of side surfaces may be disposed vertically, inclined or convex from the upper surface of the substrate 100 or/and the reflective layer 120. The upper surface of the resin layer 300 may be disposed on inner regions of the plurality of side surfaces. The upper surface of the resin layer 300 may be horizontally disposed in a direction orthogonal to the side surfaces.

The phosphor layer 400 may be disposed around the resin layer 300. The phosphor layer 400 may include a transparent material. The phosphor layer 400 may include a phosphor or a wavelength converting material in a transparent insulating material. The phosphor layer 400 may be disposed on an upper surface or/and a side surface of the resin layer 300. The phosphor layer 400 may convert the wavelength of some light emitted from the light emitting device 100.

The phosphor layer 400 may be formed of silicon, and may be formed of silicon having different chemical bonds. The silicon is a polymer in which silicon as an inorganic material and carbon as an organic material are combined, and has physical properties such as thermal stability, chemical stability, abrasion resistance, gloss, etc., as well as reactivity, solubility, elasticity, and processability, which are characteristics of organic materials. Silicone may include general silicone, and fluorine silicone with an increased fluorine ratio. Here, when the fluorine ratio of the fluorine silicone is increased, moisture-proof properties may be improved.

The phosphor layer 400 may include a wavelength converting means for receiving light emitted from the light emitting device 200 and providing wavelength-converted light. For example, the phosphor layer 400 may include at least one selected from a group including phosphors, quantum dots, and the like. The phosphor or quantum dot may emit blue, green, or red light.

The phosphor may be evenly disposed inside the phosphor layer 400. The phosphor may include a phosphor of a fluoride compound, and for example, may include at least one of an MGF-based phosphor, a KSF-based phosphor or a KTF-based phosphor. The phosphor may emit light with different peak wavelengths, and may emit light emitted from the light emitting device 200 with different yellow and red or different red peak wavelengths. When the phosphor is a red phosphor, the red phosphor may have a wavelength range of 610 nm to 650 nm, and the wavelength may have a width of less than 10 nm. The red phosphor may include a fluorite-based phosphor. The fluorite-based phosphor may include at least one of KSF-based red $K_2SiF_6:Mn^{4+}$, $K_2TiF_6:Mn^{4+}$, $NaYF_4:Mn^{4+}$, $NaGdF_4:Mn^{4+}$, and $K_3SiF_7:Mn^{4+}$. The KSF-based phosphor, for example, $KaSi_{1-c}Fb:Mn^{4+}c$, may have a composition formula, wherein the a may satisfy $1 \leq a \leq 2.5$, the b may satisfy $5 \leq b \leq 6.5$, and the c may satisfy $0.001 \leq c \leq 0.1$. In addition, the fluorite-based red phosphor may be coated with a fluoride containing no Mn, or an organic material coating may be further included on the surface of the phosphor or on the surface of the fluoride coating containing no Mn in order to improve reliability at high temperature/high humidity. In the case of the above-described fluorite-based red phosphor, unlike other phosphors, since a width of 10 nm or less may be realized, it may be used in a high-resolution device. The composition of the elements constituting the phosphor according to the embodiment should basically conform to stoichiometry, and each element may be substituted with another element in each group on the periodic table. For example, Sr may be substituted with Ba, Ca, Mg, etc. of the alkaline earth (II) group, and Y may be substituted with Tb, Lu, Sc, Gd, etc. of the lanthanum series. In addition, Eu or the like as an activator may be substituted with Ce, Tb, Pr, Er, Yb, etc. according to a desired energy level, and a sub-active agent or the like may be additionally applied to the activator alone or to modify properties.

The quantum dots may include an II-VI compound or a III-V compound semiconductor, and may emit red light. The quantum dots may be formed of, for example, ZnS, ZnSe, ZnTe, CdS, CdSe, CdTe, GaN, GaP, GaAs, GaSb, InP, InAs, In, Sb, AlS, AlP, AlAs, PbS, PbSe, Ge, Si, CuInS2, CuInSe2 and the like, and combinations thereof.

The phosphor layer 400 may include a first phosphor layer 410 disposed on an upper surface of the resin layer 300 and a second phosphor layer 420 disposed on a side surface of the resin layer 300. The second phosphor layer 420 may be disposed at an edge of the substrate 100 or may be disposed along an outer side of the resin layer 300. The first phosphor layer 410 may be adhered to the upper surface of the resin layer 300. The second phosphor layer 420 may be disposed on at least one, two, or all of the side surfaces of the resin layer 300. The second phosphor layer 420 may contact at least one, two, or all of the side surfaces of the resin layer 300. The second phosphor layer 420 may be disposed as a single layer or a plurality of regions having one kind of phosphor, or a plurality of second phosphor layers or regions having different kinds of phosphor along the side surfaces of the resin layer 300. The second phosphor layer 420 may be spaced apart or separated from the first phosphor layer 410. The upper surface of the second phosphor layer 420 may be disposed equal to or lower than the lower surface of the first phosphor layer 410. The first phosphor layer 410 may overlap the plurality of light emitting devices 200 in a vertical direction. The second phosphor layer 420 may not overlap the plurality of light emitting devices 200 in a vertical direction. A lower portion of the second phosphor layer 420 may overlap the plurality of light emitting devices 200 in a horizontal direction.

The first phosphor layer 410 may convert light emitted from the light emitting device 200 into first light or a first color. The inside of the first phosphor layer 410 may include a first phosphor for converting light into the first light or the first color. The first phosphor layer 410 may be formed of a single layer or may be formed of a plurality of layers. The first light or the first color may include light having the same peak wavelength or different peak wavelengths.

The second phosphor layer 420 may convert light emitted from the light emitting device 200 into second light or a second color. The second phosphor layer 420 may include a second phosphor for converting light into the second light or the second color. The second light or the second color may include light having the same peak wavelength or different peak wavelengths.

The illumination device according to an embodiment of the invention may emit light of various colors by disposing phosphor layers that generate different colors on the light emitting surface of the resin layer 300. Here, two colors may be mixed at the boundary of the phosphor layer emitting different colors. For example, when the first phosphor layer 410 and the second phosphor layer 420 overlap in the horizontal direction or the vertical direction, the light mixed by the first phosphor layer 410 and the second phosphor layer 420 may be emitted to outer side. When the mixed light is emitted to the outside, there may be a problem in that light of an unwanted color is emitted. In order to prevent this, the illumination device according to an embodiment of the invention may arrange the light blocking layer 500 in a boundary region between phosphor layer(s) having different colors.

The light blocking layer 500 may be disposed between the first phosphor layer 410 and the second phosphor layer 420. The light blocking layer 500 may overlap the first phosphor layer 410 in the horizontal direction or a left-right direction. The light blocking layer 500 may overlap the second phosphor layer 420 in the vertical direction or an up-down direction. The light blocking layer 500 may be disposed along an edge of a side surface of the first phosphor layer 410. The light blocking layer 500 may be disposed along an upper surface of the second phosphor layer 420. The light blocking layer 500 may contact a side surface of the first phosphor layer 410 and an upper surface of the second phosphor layer 420. The light blocking layer 500 may not overlap the light emitting devices 200 in the vertical direction. The light blocking layer 500 may not overlap the light emitting devices 200 in the horizontal direction. The light blocking layer 500 may include a region in contact with or/and non-contact with the edge of the resin layer 300.

A width w2 of the light blocking layer 500 is a length in the horizontal direction from the side surface of the first phosphor layer 410, and may be the same as a width w1 of the second phosphor layer 420. The width w2 may be a width at an upper surface or a lower surface of the light blocking layer 500, and the width w1 may be a width of an upper surface or/and a lower surface of the second phosphor layer 420. The light blocking layer 500 may be formed in a ring shape or a frame shape outside the first phosphor layer 410. The ring shape or frame shape may be a continuously connected shape or a discontinuous connected shape. The light blocking layer 500 may have an open region, and the open region may be the same as an upper region of the resin layer 300 or may be an inner region of the second phosphor layer 420.

A thickness t2 of the light blocking layer 500 may be the same as the thickness t1 of the first phosphor layer 410. The thickness t1 of the first phosphor layer 410 is a length from a lower surface to an upper surface. The thickness t2 of the light blocking layer 500 may be a length in a direction toward the upper surface of the first phosphor layer 410 or the light blocking layer 500 from the upper surface of the resin layer 300 or the second phosphor layer 420. The height of side surface of the light blocking layer 500 may be the same as the height of side surface of the first phosphor layer 400. The light blocking layer 500 may be formed so as not to protrude to the outside of the first phosphor layer 410 and the second phosphor layer 420. The upper surface of the light blocking layer 500 may be disposed on the same horizontal surface as the upper surface of the first phosphor layer 410. The light blocking layer 500 may be formed of a material capable of blocking or absorbing light. The light blocking layer 500 may include at least one of SiO2, TiO2, CaCO3, BaSO4, and Al2O3 in a resin material. The light blocking layer 550 may include white silicon. The resin material of the light blocking layer 500 may be formed the same as the resin material of the phosphor layer 400. Accordingly, the light blocking layer 500 may have improved adhesion to the phosphor layer 400.

Since the light blocking layer 500 as described above is disposed at an interface between phosphor layers displaying different colors, there is an effect of preventing colors mixed by different colors from being displayed to the outer side.

The light blocking layer 500 according to the embodiment of the invention may be variously disposed according to the arrangement structure of the phosphor layer 400. Hereinafter, the arrangement structure of the light blocking layer will be described with reference to FIGS. 3 to 10. In the description of FIGS. 3 to 10, the substrate 100, the light emitting device 200, and the resin layer 300 refer to the description of the first embodiment, and may be selectively applied to the modified example(s).

Figure 3:
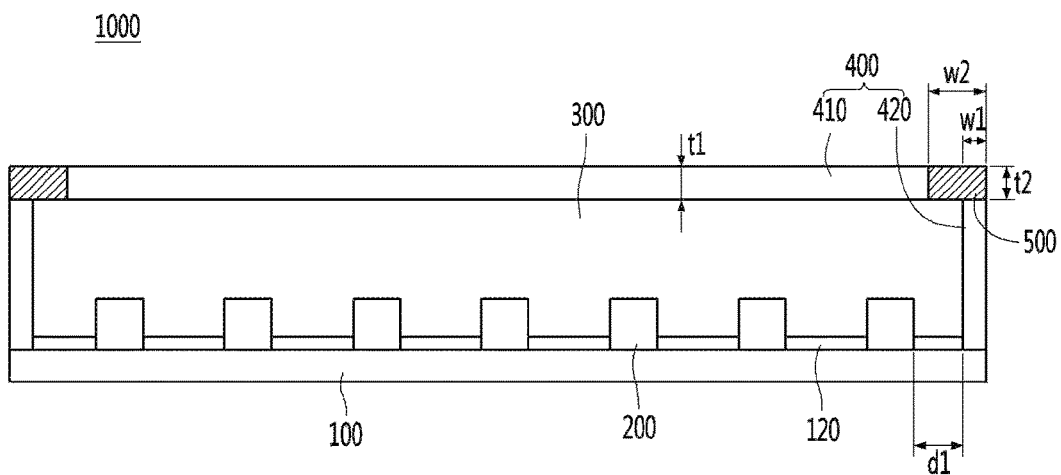
FIGS. 3 to 10 are cross-sectional views showing various modified examples of the illumination device according to the first embodiment of the invention.

Referring to FIG. 3, an illumination device 1000 according to an embodiment of the invention includes a substrate 100, a plurality of light emitting devices 200 disposed on the substrate 100, and a resin layer 300 disposed on the plurality of light emitting devices 200, a first phosphor layer 410 disposed on an upper surface of the resin layer 300, a second phosphor layer 420 disposed on a side surface of the resin layer 300, and a light blocking layer 500 disposed between the first phosphor layer 410 and the second phosphor layer 420.

The substrate 100 may include an insulating or conductive material. The substrate 100 may be formed of a rigid or flexible material. The substrate 100 may be formed of a transparent or opaque material. The reflective layer 120 for reflecting light generated from the light emitting device 200 may be formed on the upper surface of the substrate 100. The light emitting device 200 may be disposed on the substrate 100. The plurality of the light emitting devices 200 may be disposed at regular intervals. The resin layer 300 may be disposed to surround the light emitting device 200. The resin layer 300 may be a transparent resin material, for example, a resin material such as UV (Ultra violet) resin, silicone, or epoxy. The resin layer 300 may further include a diffusion bead therein.

The phosphor layer 400 may include the first phosphor layer 410 and the second phosphor layer 420. The first phosphor layer 410 may be disposed on the upper surface of the resin layer 300. The first phosphor layer 410 may include a first phosphor for converting light emitted from the light emitting device 200 into a first light or a first color. The second phosphor layer 420 may be disposed on a side surface of the resin layer 300. The second phosphor layer 420 may be disposed on the edge of the substrate 100. The second phosphor layer 420 may include a second phosphor for converting the light emitted from the light emitting device 200 into second light or a second color.

The light blocking layer 500 may be disposed between the first phosphor layer 410 and the second phosphor layer 420. The light blocking layer 500 may be disposed on a side surface of the first phosphor layer 410 and an upper surface of the second phosphor layer 420. The light blocking layer 500 may be formed of a material capable of blocking or absorbing light. The light blocking layer 500 may include at least one of SiO2, TiO2, CaCO3, BaSO4, and Al2O3 in a resin material. The light blocking layer 500 may include white silicon.

The width w2 of the light blocking layer 500 may be larger than the width w1 of the second phosphor layer 420. The width w2 of the upper surface of the light blocking layer 500 may be greater than the width w1 of the upper surface of the second phosphor layer 420. The width w2 of the light blocking layer 500 is a length from the outer side to the inner side, and may be a straight distance or a minimum distance from the outer side of the first phosphor layer 410 to the outer side of the light blocking layer 500. The light blocking layer 500 may not overlap with the light emitting devices 200 in the vertical direction. The inner side of the light blocking layer 500 may be disposed further inside than the side surface of the resin layer 300, that is, the outer side thereof. The inner side of the light blocking layer 500 may be disposed further outside of the outermost light emitting device among the light emitting devices 200, and may be disposed further inside than the outer side of the resin layer 300. The thickness t2 of the light blocking layer 500 may correspond to the thickness t1 of the first phosphor layer 410.

A portion of the light blocking layer 500 may be disposed on the resin layer 300. The light blocking layer 500 may overlap the resin layer 300 in the vertical direction or the vertical direction. The inner side of the light blocking layer 500 may be in contact with the side surface of the first phosphor layer 410. The lower surface of the light blocking layer 500 may be in contact with the upper surface of the resin layer 300 and the upper surface of the second phosphor layer 420. Since the lower surface of the light blocking layer 500 is in contact with the upper surfaces of the resin layer 300 and the second phosphor layer 420, a contact area with other layers may be increased. From this, there is an effect of preventing the light blocking layer 500 from being separated from the phosphor layer 400 and being separated from the outer side. The open region disposed inside the light blocking layer 500 may have a polygonal ring shape or a circular ring shape, and may correspond to an upper region of the first phosphor layer 410.

The width w2 of the light blocking layer 500 is smaller than the sum of the width w1 of the second phosphor layer 420 and a distance between the second phosphor layer 420 and the light emitting device 200 disposed at the outermost side. The light blocking layer 500 is disposed not to overlap on the light emitting device 200, thereby preventing light efficiency from being decreased. The light blocking layer 500 extends toward the center region of the first phosphor layer 410, thereby preventing light generated inside the second phosphor layer 420 from being emitted toward the vertical direction or an upper direction. The light blocking layer 500 may reduce interference between the first light or the first color emitted from the first phosphor layer 410 and the second light or the second color emitted from the second phosphor layer 420.

Figure 4:
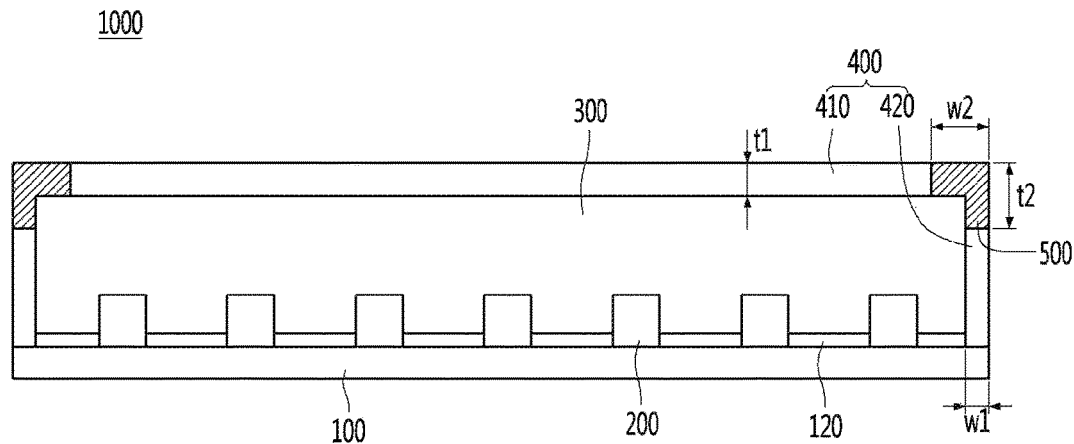

Referring to FIG. 4, an illumination device 1000 according to an embodiment of the invention includes a substrate 100, a plurality of light emitting devices 200 disposed on the substrate 100, and a resin layer 300 disposed on the plurality of light emitting devices 200, a first phosphor layer 410 disposed on an upper surface of the resin layer 300, a second phosphor layer 420 disposed on a side surface of the resin layer 300, and a light blocking layer 500 disposed between the first phosphor layer 410 and the second phosphor layer 420.

The substrate 100 may include an insulating or conductive material. The substrate 100 may be formed of a rigid or flexible material. The substrate 100 may be formed of a transparent or opaque material. The reflective layer 120 for reflecting light generated from the light emitting device 200 may be formed on the upper surface of the substrate 100. The light emitting device 200 may be disposed on the substrate 100. The plurality of the light emitting devices 200 may be disposed at regular intervals. The resin layer 300 may be disposed to surround the light emitting device 200. The resin layer 300 may be a transparent resin material, for example, a resin material such as UV (Ultra violet) resin, silicone, or epoxy. The resin layer 300 may further include a diffusion bead therein.

The phosphor layer 400 may include a first phosphor layer 410 and a second phosphor layer 420. The first phosphor layer 410 may be disposed on the upper surface of the resin layer 300. The first phosphor layer 410 may include a first phosphor for converting light emitted from the light emitting device 200 into first light or a first color. The second phosphor layer 420 may be disposed on a side surface of the resin layer 300. The second phosphor layer 420 may be disposed on the edge of the substrate 100. The second phosphor layer 420 may include a second phosphor for converting light emitted from the light emitting device 200 into second light or a second color.

The light blocking layer 500 may be disposed between the first phosphor layer 410 and the second phosphor layer 420. The light blocking layer 500 may be disposed on a side surface of the first phosphor layer 410 and an upper surface of the second phosphor layer 420. The light blocking layer 500 may be formed of a material capable of blocking or absorbing light. The light blocking layer 500 may include white silicon. The light blocking layer 500 may have a vertically bent shape. The inner portion of the light blocking layer 500 may extend to an outer upper surface of the resin layer 300, and a lower portion thereof may extend to an upper portion of side surface of the resin layer 300. The light blocking layer 500 may include a portion extending from an upper edge of the resin layer 300 toward a center of the upper surface of the resin layer 300 in a horizontal direction and a portion extending toward the substrate in the vertical direction. Accordingly, the light blocking layer 500 may overlap the first phosphor layer 410 and the upper side surfaces of the resin layer 300 in the horizontal direction or a left-right direction. In the vertical direction, the light blocking layer 500 may be overlapped outside the upper surfaces of the second phosphor layer 410 and the resin layer 300. The width w2 of the light blocking layer 500 disposed on the side surface of the first phosphor layer 410 may be larger than the width w1 of the second phosphor layer 420. The thickness t2 of the light blocking layer 500 disposed on the upper surface of the second phosphor layer 420 may be greater than the thickness t1 of the first phosphor layer 410.

The inner portion of the light blocking layer 500 may overlap the resin layer 300 in the vertical direction or an up-down direction. A lower portion of an outer side of the light blocking layer 500 may overlap the resin layer 300 in the horizontal direction or the left-right direction. The inner surface of the light blocking layer 500 may be in contact with the upper surface and the side surface of the resin layer 300. The light blocking layer 500 is provided in a wide area on a region where the light is mixed or on a region between the first phosphor layer 410 and the second phosphor layer 420, thereby further improving a light blocking effect. The light blocking layer 500 may increase the contact area with the resin layer 300, thereby improving adhesion to the light blocking layer 500, and providing a blocking effect of the second color or the second light emitted from the second phosphor layer 420.

Figure 5:
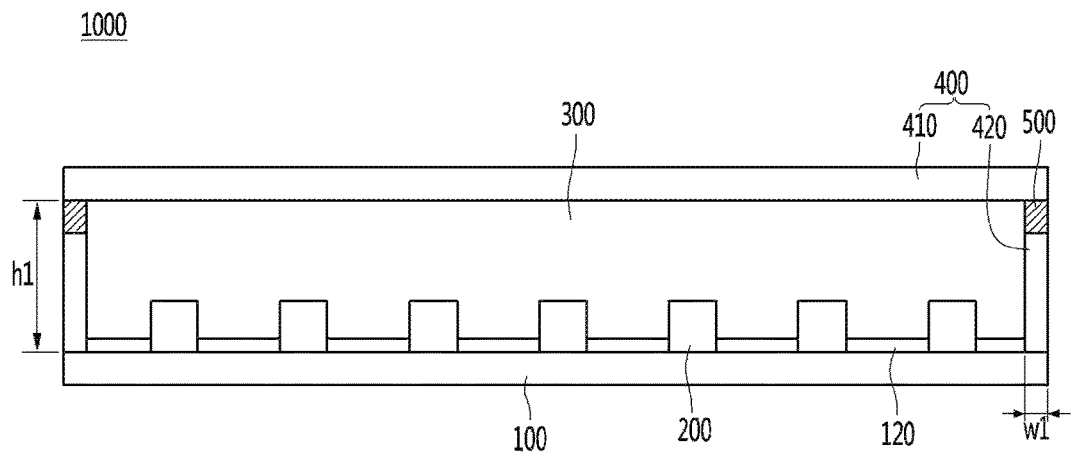

Referring to FIG. 5, an illumination device 1000 according to an embodiment of the invention includes a substrate 100, a plurality of light emitting devices 200 disposed on the substrate 100, and a resin layer 300 disposed on the plurality of light emitting devices 200, a first phosphor layer 410 disposed on an upper surface of the resin layer 300, a second phosphor layer 420 disposed on a side surface of the resin layer 300, and a light blocking layer 500 disposed between the first phosphor layer 410 and the second phosphor layer 420.

The substrate 100 may include an insulating or conductive material. The substrate 100 may be formed of a rigid or flexible material. The substrate 100 may be formed of a transparent or opaque material. The reflective layer 120 for reflecting light generated from the light emitting device 200 may be formed on the upper surface of the substrate 100.

The light emitting device 200 may be disposed on the substrate 100. The plurality of the light emitting devices 200 may be disposed at regular intervals. The resin layer 300 may be disposed to surround the light emitting device 200. The resin layer 300 may be a transparent resin material, for example, a resin material such as UV (Ultra violet) resin, silicone, or epoxy. The resin layer 300 may further include a diffusion bead therein.

The phosphor layer 400 may include a first phosphor layer 410 and a second phosphor layer 420. The first phosphor layer 410 may be disposed on the upper surface of the resin layer 300. The first phosphor layer 410 may include a first phosphor for converting light emitted from the light emitting device 200 into first light or a first color. The second phosphor layer 420 may be disposed on a side surface of the resin layer 300. The second phosphor layer 420 may be disposed on the edge of the substrate 100. The second phosphor layer 420 may include a second phosphor for converting light emitted from the light emitting device 200 into second light or a second color.

The light blocking layer 500 may be disposed between the first phosphor layer 410 and the second phosphor layer 420. The upper surface height of the light blocking layer 500 may be equal to or lower than the upper surface height h1 of the resin layer 300. The light blocking layer 500 may be disposed on a lower surface of the first phosphor layer 410 and an upper surface of the second phosphor layer 420. The light blocking layer 500 may be formed of a material capable of blocking or absorbing light. The light blocking layer 500 may include white silicon. The light blocking layer 500 may overlap the first phosphor layer 410 and the second phosphor layer 420 in a vertical direction or an up-down direction. An upper surface of the light blocking layer 500 may be in contact with a lower surface of the first phosphor layer 410, and a lower surface of the light blocking layer 500 may be in contact with an upper surface of the second phosphor layer 420. The inner side surface of the light blocking layer 500 may be in contact with the side surface of the resin layer 300. The inner side surface of the light blocking layer 500 may be non-contact with the upper surface of the resin layer 300. The light blocking layer 500 may not overlap the first phosphor layer 410 in a horizontal direction or a left-right direction. The upper surface of the light blocking layer 500 may be disposed equal to or lower than the upper surface of the resin layer 300. An outer surface of the light blocking layer 500 may be disposed on a vertical plane such as a side surface of the first phosphor layer 410 and an outer side surface of the second phosphor layer 420. The light blocking layer 500 is disposed under the first phosphor layer 410 and effectively block the light generated from the second phosphor layer 420 disposed under the first phosphor layer 410. The light blocking layer 500 has an effect of improving adhesion by making contact with the first phosphor layer 410, the second phosphor layer 420, and the resin layer 300.

Figure 6:
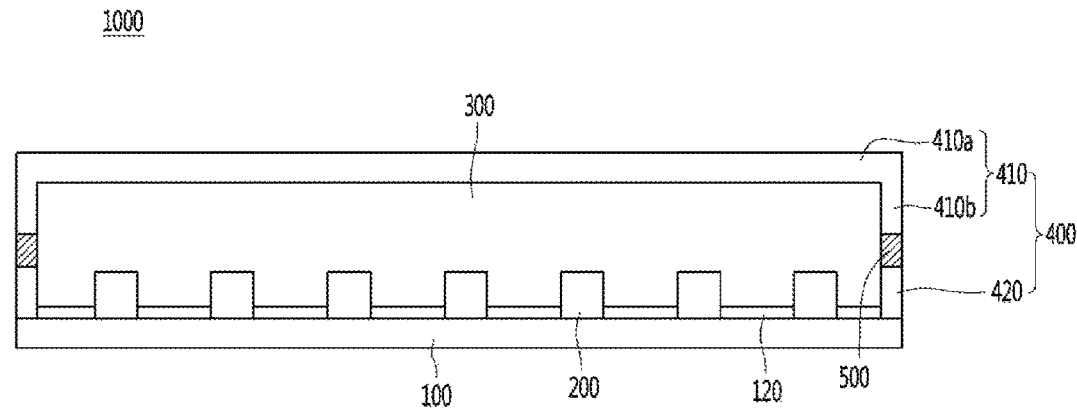

Referring to FIG. 6, an illumination device 1000 according to an embodiment of the invention includes a substrate 100, a plurality of light emitting devices 200 disposed on the substrate 100, and a resin layer 300 disposed on the plurality of light emitting devices 200, a first phosphor layer 410 disposed on an upper surface of the resin layer 300, a second phosphor layer 420 disposed on a side surface of the resin layer 300, and a light blocking layer 500 disposed between the first phosphor layer 410 and the second phosphor layer 420.

The substrate 100 may include an insulating or conductive material. The substrate 100 may be formed of a rigid or flexible material. The substrate 100 may be formed of a transparent or opaque material. A reflective layer 120 for reflecting light generated from the light emitting device 200 may be formed on the upper surface of the substrate 100. The light emitting device 200 may be disposed on the substrate 100. The plurality of the light emitting devices 200 may be disposed at regular intervals. The resin layer 300 may be disposed to surround the light emitting device 200. The resin layer 300 may be a transparent resin material, for example, a resin material such as UV (Ultra violet) resin, silicone, or epoxy. The resin layer 300 may further include a diffusion bead therein.

The phosphor layer 400 may include a first phosphor layer 410 and a second phosphor layer 420. The first phosphor layer 410 may be disposed on the upper and side surfaces of the resin layer 300. The first phosphor layer 410 may include a first phosphor for converting light emitted from the light emitting device 200 into first light or a first color. The first phosphor layer 410 may include a first region 410a disposed on an upper surface of the resin layer 300 and a second region 410b disposed on a side surface of the resin layer 300. The first region 410a and the second region 410b may be connected to each other. The second phosphor layer 420 may be disposed on a side surface of the resin layer 300. The second phosphor layer 420 may overlap the second region 410b of the first phosphor layer 410 in a vertical direction or an up-down direction. The second phosphor layer 420 may be disposed on the edge of the substrate 100. The second phosphor layer 420 may include a second phosphor for converting light emitted from the light emitting device 200 into second light or a second color.

The light blocking layer 500 may be disposed between the first phosphor layer 410 and the second phosphor layer 420. The light blocking layer 500 may be disposed on a lower surface of the second region 410b of the first phosphor layer 410 and an upper surface of the second phosphor layer 420. The light blocking layer 500 may overlap the first phosphor layer 410 and the second phosphor layer 420 in a vertical direction or an up-down direction. The lower surface of the light blocking layer 500 or the upper surface of the second phosphor layer 420 may be disposed higher than the upper surface of the light emitting device 200. The light blocking layer 500 may be formed of a material capable of blocking or absorbing light. The light blocking layer 500 may include white silicon.

The light blocking layer 500 may overlap the second region 410b of the first phosphor layer 410 and the second phosphor layer 420 in a vertical direction or an up-down direction. The upper surface of the light blocking layer 500 is in contact with the lower surface of the second region 410b of the first phosphor layer 410, the lower surface of the light blocking layer 500 is in contact with the upper surface of the second phosphor layer 420, and the inner side surface of the light blocking layer 500 may be in contact with the side surface of the resin layer 300. The light blocking layer 500 is disposed under the first phosphor layer 410, so that the second light generated by the second phosphor layer 420 spaced apart from the first phosphor layer 410 in the direction of the substrate may be effectively blocked. The light blocking layer 500 has an effect of improving adhesion by making contact with the first phosphor layer 410, the second phosphor layer 420, and the resin layer 300.

Figure 7:
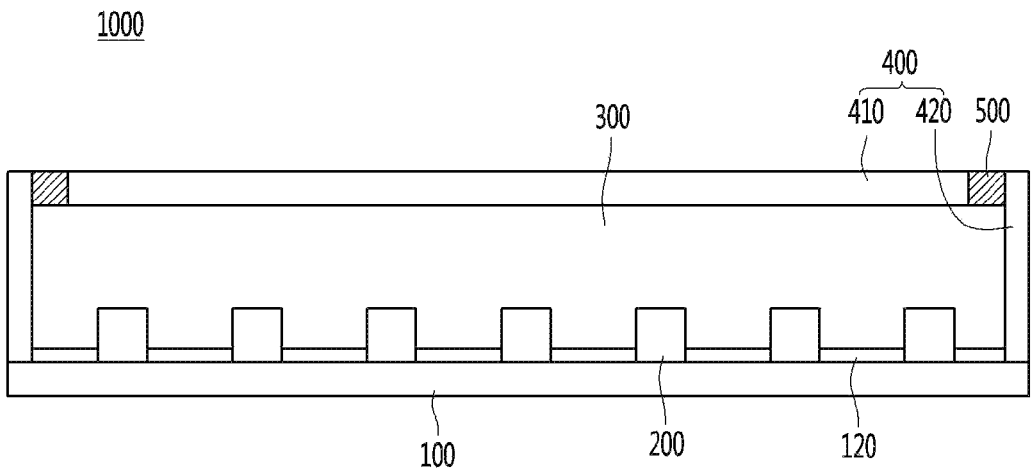

Referring to FIG. 7, an illumination device 1000 according to an embodiment of the invention includes a substrate 100, a plurality of light emitting devices 200 disposed on the substrate 100, and a resin layer 300 disposed on the plurality of light emitting devices 200, a first phosphor layer 410 disposed on an upper surface of the resin layer 300, a second phosphor layer 420 disposed on a side surface of the resin layer 300, and a light blocking layer 500 disposed between the first phosphor layer 410 and the second phosphor layer 420.

The substrate 100 may include an insulating or conductive material. The substrate 100 may be formed of a rigid or flexible material. The substrate 100 may be formed of a transparent or opaque material. A reflective layer 120 for reflecting light generated from the light emitting device 200 may be formed on the upper surface of the substrate 100. The light emitting device 200 may be disposed on the substrate 100. A plurality of light emitting devices 200 may be disposed at regular intervals. The resin layer 300 may be disposed to surround the light emitting device 200. The resin layer 300 may be a transparent resin material, for example, a resin material such as UV (Ultra violet) resin, silicone, or epoxy. The resin layer 300 may further include a diffusion bead therein. The phosphor layer 400 may include a first phosphor layer 410 and a second phosphor layer 420. The first phosphor layer 410 may be disposed on the upper surface of the resin layer 300. The first phosphor layer 410 may include a first phosphor for converting light emitted from the light emitting device 200 into a first color. The second phosphor layer 420 may be disposed on a side surface of the resin layer 300 and a side surface of the first phosphor. The second phosphor layer 420 may be disposed on the edge of the substrate 100. The second phosphor layer 420 may include a second phosphor for converting light emitted from the light emitting device 200 into a second color. The second phosphor layer 420 may be disposed to surround the first phosphor layer 410. An upper portion of the second phosphor layer 420 may serve as an edge of the first phosphor layer 410. An upper portion of the second phosphor layer 420 may overlap the first phosphor layer 410 and the light blocking layer 500 in a horizontal direction.

The light blocking layer 500 may be disposed between the first phosphor layer 410 and the second phosphor layer 420. The light blocking layer 500 may be disposed on a side surface of the first phosphor layer 410 and a side surface of the second phosphor layer 420. The light blocking layer 500 may not overlap the light emitting device 200 in a vertical direction. The light blocking layer 500 may not overlap the second phosphor layer 420 in the vertical direction. Accordingly, the light blocking layer 500 separates regions of the first phosphor layer 410 and the second phosphor layer 420 above the resin layer 300 and may suppress interference between lights as much as possible. Accordingly, the light emitting surface of the first phosphor layer 410 and the second phosphor layer 420 may be exposed on the resin layer 300. The light blocking layer 500 may be formed of a material capable of blocking or absorbing light. The light blocking layer 500 may include white silicon. The light blocking layer 500 may overlap the resin layer 300 in a vertical direction or an up-down direction. Accordingly, the light blocking layer 500 may contact the side surface of the first phosphor layer 410, the side surface of the second phosphor layer 420, and the upper surface of the resin layer 300.

The light blocking layer 500 has an effect of preventing color mixing at an interface between the first phosphor layer 410 and the second phosphor layer 420. Since the light blocking layer 500 is disposed between the first phosphor layer 410 and the second phosphor layer 420, the edge of the illumination may be expressed in different colors. The light blocking layer 500 is in contact with the first phosphor layer 410, the second phosphor layer 420, and the resin layer 300, so that adhesion may be further improved.

Figure 8:
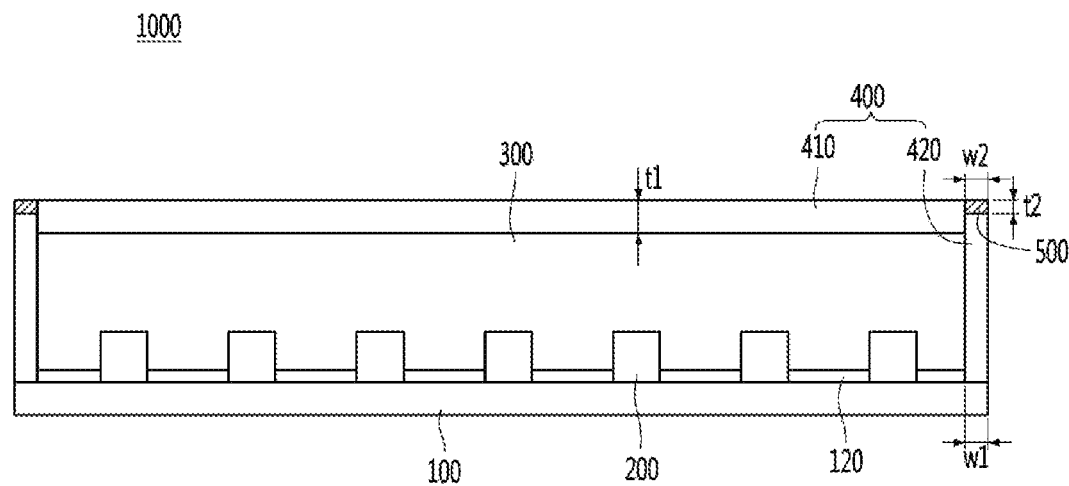

Referring to FIG. 8, an illumination device 1000 according to an embodiment of the invention includes a substrate 100, a plurality of light emitting devices 200 disposed on the substrate 100, and a resin layer 300 disposed on the plurality of light emitting devices 200, a first phosphor layer 410 disposed on an upper surface of the resin layer 300, a second phosphor layer 420 disposed on a side surface of the resin layer 300, and a light blocking layer 500 disposed between the first phosphor layer 410 and the second phosphor layer 420.

The substrate 100 may include an insulating or conductive material. The substrate 100 may be formed of a rigid or flexible material. The substrate 100 may be formed of a transparent or opaque material. A reflective layer 120 for reflecting light generated from the light emitting device 200 may be formed on the upper surface of the substrate 100. The light emitting device 200 may be disposed on the substrate 100. A plurality of the light emitting devices 200 may be disposed at regular intervals. The resin layer 300 may be disposed to surround the light emitting device 200. The resin layer 300 may be a transparent resin material, for example, a resin material such as UV (Ultra violet) resin, silicone, or epoxy. The resin layer 300 may further include a diffusion bead therein. The phosphor layer 400 may include a first phosphor layer 410 and a second phosphor layer 420. The first phosphor layer 410 may be disposed on the upper surface of the resin layer 300. The first phosphor layer 410 may include a first phosphor for converting light emitted from the light emitting device 200 into first light or a first color. The second phosphor layer 420 may be disposed on the side surface of the resin layer 300. The second phosphor layer 420 may be disposed on the edge of the substrate 100. The second phosphor layer 420 may include a second phosphor for converting light emitted from the light emitting device 200 into second light or a second color.

The light blocking layer 500 may be disposed between the first phosphor layer 410 and the second phosphor layer 420. The light blocking layer 500 may be disposed on a side surface of the first phosphor layer 410 and an upper surface of the second phosphor layer 420. The light blocking layer 500 may be formed of a material capable of blocking or absorbing light. The thickness t2 of the light blocking layer 500 may be smaller than the thickness t1 of the first phosphor layer 410. The thickness t2 of the light blocking layer 500 may be provided with a thickness through which light cannot be transmitted, for example, a thickness of nanometers. The light blocking layer 500 may be formed by printing on the second phosphor layer 420 to have a thickness of nanometers. To this end, the light blocking layer 500 may include a film or ink. A side surface of the first phosphor layer 410 may contact a side surface of the light blocking layer 500 and a side surface of the second phosphor layer 420. The upper surface of the light blocking layer 500 may be disposed on the same line as the upper surface of the first phosphor layer 410. The light blocking layer 500 may not overlap with the resin layer 300 in a vertical direction or a horizontal direction. A side surface of the light blocking layer 500 may be disposed on the same line as an outer surface of the second phosphor layer 420. From this, the light blocking layer 500 does not protrude to the outside.

Since the light blocking layer 500 according to the embodiment of the invention is formed by a printing technique, its thickness may be remarkably reduced, and thus, there is an effect of securing a wider area of light emitted from the phosphor. In addition, since the light blocking layer 500 according to an embodiment of the invention is formed by a printing technique, adhesion may be improved and a process may be simplified.

Figure 9:
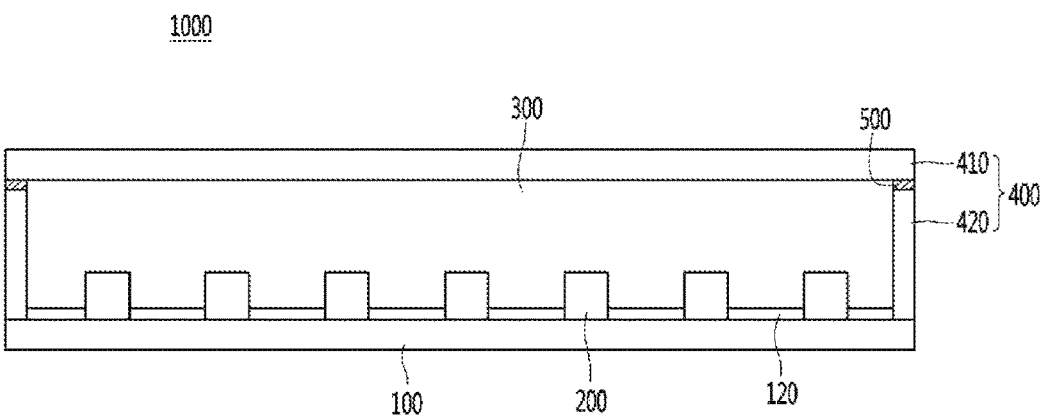

Referring to FIG. 9, an illumination apparatus 1000 according to an embodiment of the invention includes a substrate 100, a plurality of light emitting devices 200 disposed on the substrate 100, and a resin layer 300 disposed on the plurality of light emitting devices 200, a first phosphor layer 410 disposed on an upper surface of the resin layer 300, a second phosphor layer 420 disposed on a side surface of the resin layer 300, and a light blocking layer 500 disposed between the first phosphor layer 410 and the second phosphor layer 420.

The substrate 100 may include an insulating or conductive material. The substrate 100 may be formed of a rigid or flexible material. The substrate 100 may be formed of a transparent or opaque material. A reflective layer 120 for reflecting light generated from the light emitting device 200 may be formed on the upper surface of the substrate 100. The light emitting device 200 may be disposed on the substrate 100. The plurality of the light emitting devices 200 may be disposed at regular intervals. The resin layer 300 may be disposed to surround the light emitting device 200. The resin layer 300 may be a transparent resin material, for example, a resin material such as UV (Ultra violet) resin, silicone, or epoxy. The resin layer 300 may further include a diffusion bead therein.

The phosphor layer 400 may include a first phosphor layer 410 and a second phosphor layer 420. The first phosphor layer 410 may be disposed on the upper surface of the resin layer 300. The first phosphor layer 410 may include a first phosphor for converting light emitted from the light emitting device 200 into first light or a first color. The second phosphor layer 420 may be disposed on a side surface of the resin layer 300. The second phosphor layer 420 may be disposed on the edge of the substrate 100. The second phosphor layer 420 may include a second phosphor for converting light emitted from the light emitting device 200 into second light or a second color.

The light blocking layer 500 may be disposed between the first phosphor layer 410 and the second phosphor layer 420. The light blocking layer 500 may be disposed on a lower surface of the first phosphor layer 410 and an upper surface of the second phosphor layer 420. The light blocking layer 500 may overlap the first phosphor layer 410 and the second phosphor layer 420 in a vertical direction or a vertical direction.

The light blocking layer 500 may be formed of a material capable of blocking or absorbing light. The light blocking layer 500 may include a film or ink. The light blocking layer 500 may be formed by printing on the upper surface of the second phosphor layer 420. Accordingly, the light blocking layer 500 may be formed in a nano-thickness.

The upper surface of the light blocking layer 500 may be in contact with the first phosphor layer 410, the lower surface of the light blocking layer 500 may be in contact with the upper surface of the second phosphor layer 420, and a side surface of the light blocking layer 500 may contact the side surface of the resin layer 300. According to an exemplary embodiment of the invention, by forming the light blocking layer in a nano-thickness, the thickness thereof may be remarkably reduced and the adhesive strength may be further improved.

Figure 10:
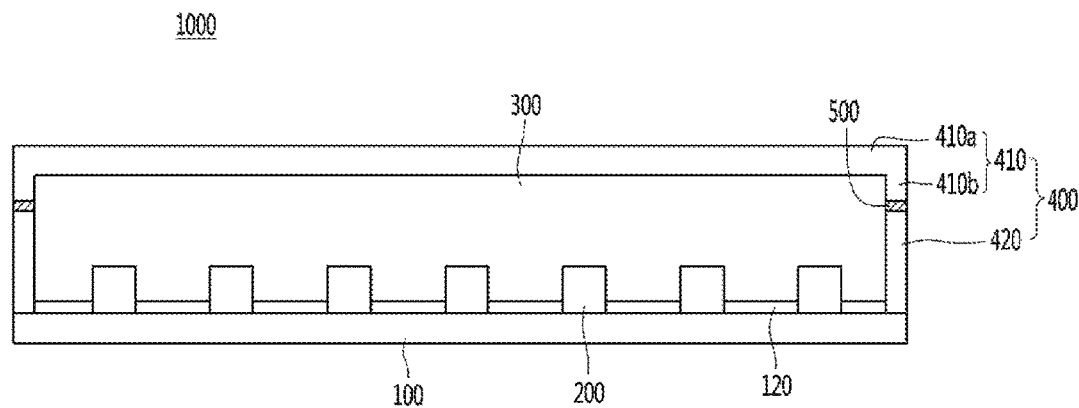

Referring to FIG. 10, an illumination device 1000 according to an embodiment of the invention includes a substrate 100, a plurality of light emitting devices 200 disposed on the substrate 100, and a resin layer 300 disposed on the plurality of light emitting devices 200, a first phosphor layer 410 disposed on an upper surface of the resin layer 300, a second phosphor layer 420 disposed on a side surface of the resin layer 300, and a light blocking layer 500 disposed between the first phosphor layer 410 and the second phosphor layer 420.

The substrate 100 may include an insulating or conductive material. The substrate 100 may be formed of a rigid or flexible material. The substrate 100 may be formed of a transparent or opaque material. A reflective layer 120 for reflecting light generated from the light emitting device 200 may be formed on the upper surface of the substrate 100. The light emitting device 200 may be disposed on the substrate 100. The plurality of the light emitting devices 200 may be disposed at regular intervals. The resin layer 300 may be disposed to surround the light emitting device 200. The resin layer 300 may be a transparent resin material, for example, a resin material such as UV (Ultra violet) resin, silicone, or epoxy. The resin layer 300 may further include a diffusion bead therein.

The phosphor layer 400 may include a first phosphor layer 410 and a second phosphor layer 420. The first phosphor layer 410 may be disposed on the upper and side surfaces of the resin layer 300. The first phosphor layer 410 may include a first region 410a disposed on the upper surface of the resin layer 300 and a second region 410b disposed on the side surface of the resin layer 300. The second region 410b refers to a region vertically bent from the first region 410a. The first phosphor layer 410 may include a first phosphor for converting light emitted from the light emitting device 200 into a first color. The second phosphor layer 420 may be disposed on a side surface of the resin layer 300. The second phosphor layer 420 may be disposed on the edge of the substrate 100. The second phosphor layer 420 may include a second phosphor for converting light emitted from the light emitting device 200 into a second color.

The light blocking layer 500 may be disposed between the first phosphor layer 410 and the second phosphor layer 420. The light blocking layer 500 may be disposed on a lower surface of the second region 410b of the first phosphor layer 410 and an upper surface of the second phosphor layer 420. The light blocking layer 500 may be disposed to vertically overlap the second region 410b of the first phosphor layer 410 and the second phosphor layer 420. The light blocking layer 500 may be formed of a material capable of blocking or absorbing light. The light blocking layer 500 may include a film or ink. The light blocking layer 500 may be formed by printing on the upper surface of the second phosphor layer 420. Accordingly, the light blocking layer 500 may be formed in a nano-thickness.

The upper surface of the light blocking layer 500 may be in contact with the second region 410b of the first phosphor layer 410, and the lower surface of the light blocking layer 500 may be contacted between the upper surface of the second phosphor layer 420. The inner side surface of the light blocking layer 500 may be in contact with the outer surface of the resin layer 300. According to an embodiment of the invention, by forming the light blocking layer in a nano-thickness, the thickness thereof may be remarkably reduced and the adhesive strength may be further improved.

Figure 11:
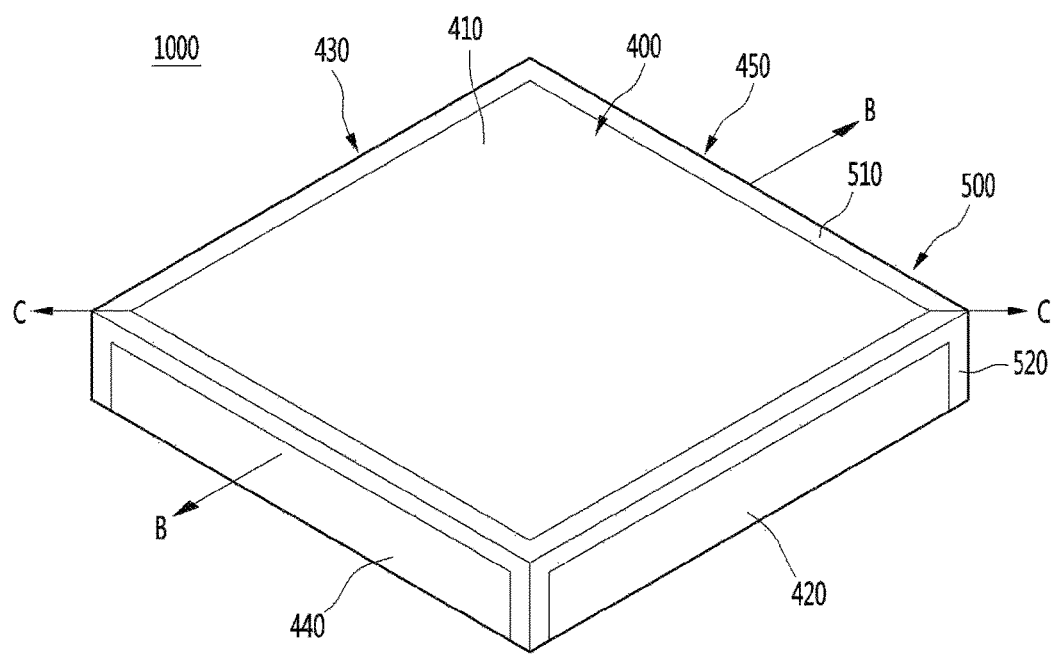
FIG. 11 is a perspective view showing an illumination device according to a second embodiment of the invention.
Figure 12:
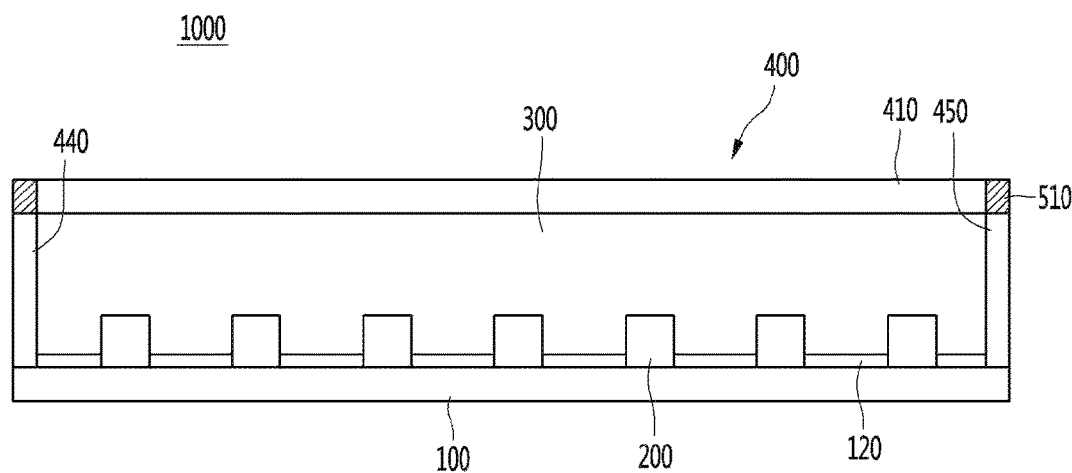
FIG. 12 is a cross-sectional view of B-B side of the illumination device of FIG. 11.
Figure 13:
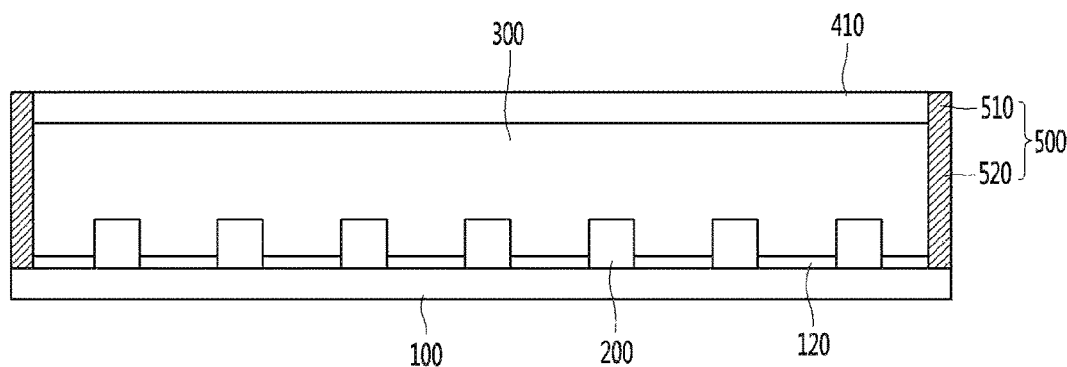
FIG. 13 is a cross-sectional view of C-C side of the illumination device of FIG. 11.

FIG. 11 is a perspective view illustrating an illumination device according to a second embodiment of the invention, FIG. 12 is a cross-sectional view taken along line B-B side of FIG. 11, and FIG. 13 is a cross-sectional view taken along line C-C side of FIG. 11. When a configuration of the second embodiment disclosed above is the same as the configuration of the first embodiment, the configuration of the first embodiment may be applied to the second embodiment.

Referring to FIG. 11, the illumination device according to the second embodiment of the invention may emit at least three or more colors to the outside. For example, a first color may be emitted from the upper surface of the illumination device, and two or five colors may be emitted from the side surface of the illumination device. Here, the illumination device has been described based on a hexahedron, but when it has a structure of a hexahedron or more, six or more colors may be emitted.

Referring to FIGS. 12 and 13, an illumination device according to an embodiment of the invention may include a light emitting device 200 disposed on a substrate (PCB: Printed Circuit Board) 100, a resin layer 300 disposed on the light emitting device 200, a first phosphor layer 410 disposed on the upper surface of the resin layer 300, second phosphor layers disposed on a side surface of the resin layer 300 to emit different colors, and a light blocking layer 500 disposed between the first phosphor layer 410 and the second phosphor layers.

The substrate 100 may include an insulating or conductive material. The substrate 100 may be formed of a rigid or flexible material. The substrate 100 may be formed of a transparent or opaque material. A reflective layer 120 for reflecting light generated from the light emitting device 200 may be formed on the upper surface of the substrate 100. The light emitting device 200 may be disposed on the substrate 100. A plurality of the light emitting devices 200 may be disposed at regular intervals. The resin layer 300 may be disposed to surround the light emitting device 200. The resin layer 300 may be a transparent resin material, for example, a resin material such as UV (Ultra violet) resin, silicone, or epoxy. The resin layer 300 may further include a diffusion bead therein.

The phosphor layer 400 may include the first phosphor layer 410 and the second phosphor layers. The first phosphor layer 410 may be disposed on the upper surface of the resin layer 300. The first phosphor layer 410 may include a first phosphor for converting light emitted from the light emitting device 200 into first light or a first color. The second phosphor layers may emit different colors. Here, the second phosphor layers disposed on the side surfaces of the resin layer 300 will be referred to as second to fifth phosphor layers 420, 430, 440, and 450 for convenience of description.

The second phosphor layer 420 may be disposed on the first side surface of the resin layer 300. The third phosphor layer 430 may be disposed on the second side surface of the resin layer 300 adjacent to the second phosphor layer 420. The fourth phosphor layer 440 may be disposed on the third side surface of the resin layer 300 to face the second phosphor layer 420. The fifth phosphor layer 450 may be disposed on the fourth side surface of the resin layer 300 to face the third phosphor layer 430. A second phosphor may be included inside the second phosphor layer 420 to convert light emitted from the light emitting device 200 into second light or a second color. A third phosphor may be included inside the third phosphor layer 430 to convert light emitted from the light emitting device 200 into third light or a third color. A fourth phosphor may be included in the fourth phosphor layer 440 to convert light emitted from the light emitting device 200 into fourth light or fourth color. A fifth phosphor may be included in the fifth phosphor layer 450 to convert light emitted from the light emitting device 200 into fifth light or fifth color. In the illumination device according to an embodiment of the invention, all colors of light emitted from the five light emitting surfaces may be formed differently. That is, the second to fifth phosphor layers 420, 430, 440, and 450 may emit light of the same color or light of different colors, and may be different from the light or color of the color of the first phosphor layer 410.

The light blocking layer 500 may be disposed between the first to fifth phosphor layers 410, 420, 430, 440 and 450. The light blocking layer 500 may contact an outer side surface of the first phosphor layer 410 and may contact upper surfaces or/and side surfaces of the second to fifth phosphor layers 420, 430, 440 and 450. The light blocking layer 500 may include a silicon material that reflects or absorbs light. The light blocking layer 500 may include a first light blocking portion 510 and a second light blocking portion 520.

The first light blocking portion 510 may be disposed to surround an edge or an outer surface of the first phosphor layer 410. The first light blocking portion 510 may be disposed on a side surface of the first phosphor layer 410 and an upper surface of the second phosphor layer 420. The width of the first light blocking portion 510 may be the same as the width of the second phosphor layer 420, and the thickness of the first light blocking portion 510 may be the same as the thickness of the first phosphor layer 410. The thickness of the first light blocking portion 510 may be selectively applied to the configuration of the embodiment or modified example disclosed above. That is, the first light blocking portion 510 may employ various structures of the light blocking layer according to the first embodiment.

The second light blocking portion 520 may be disposed between the second to fifth phosphor layers 420, 430, 440 and 450. The second light blocking portion 520 may have a structure bent downward from the first light blocking portion 510. The second light blocking portion 520 may be disposed at an interface between the second to fifth phosphor layers 420, 430, 440 and 450, respectively. The second light blocking portion 520 may be disposed in each corner region of the resin layer 300. The second light blocking portion 520 may contact each edge region of the resin layer 300. The second light blocking portion 520 may overlap the resin layer 300 in a horizontal direction. The second light blocking portion 520 may overlap the second to fifth phosphor layers 420,430,440,450 in a horizontal direction. The plurality of second light blocking portions 520 may overlap each edge region of the first light blocking portion 510 in a vertical direction. Here, the second light blocking portion 520 may be disposed in a region between two adjacent side surfaces of the resin layer 300, that is, in a corner region. A lower portion of the second light blocking portion 520 may contact the substrate 100 or/and the reflective layer 120. The lower surface of the second light blocking portion 520 may be in contact with the upper surface of the substrate 100 and may be disposed lower than the upper surface of the reflective layer 120. The second light blocking portion 510 may partially overlap the upper surface of the resin layer 300 or may contact the upper surface of the resin layer 300, as in the embodiment or modified example disclosed above. An embodiment of the invention, the light blocking portions may be disposed between a phosphor layers emitting different light or different colors or on the side surface of an illumination device, thereby the effect of preventing light from being mixed at the interface between adjacent phosphor layers.

Meanwhile, when there is no light blocking layer in the illumination device, the first light emitted from the first phosphor layer may be emitted in the upper central region of the illumination device. On the other hand, in the upper edge region of the illumination device, the light generated from the first phosphor layer and the light generated from the second phosphor may be mixed and the mixed second light may be emitted. When the light blocking layer is provided, only the first light emitted from the first phosphor layer may be emitted in the central region and the edge region of the illumination device. That is, it may be seen that light emitted from the second phosphor layer cannot be recognized at all from the upper surface of the illumination device.

Figure 14:
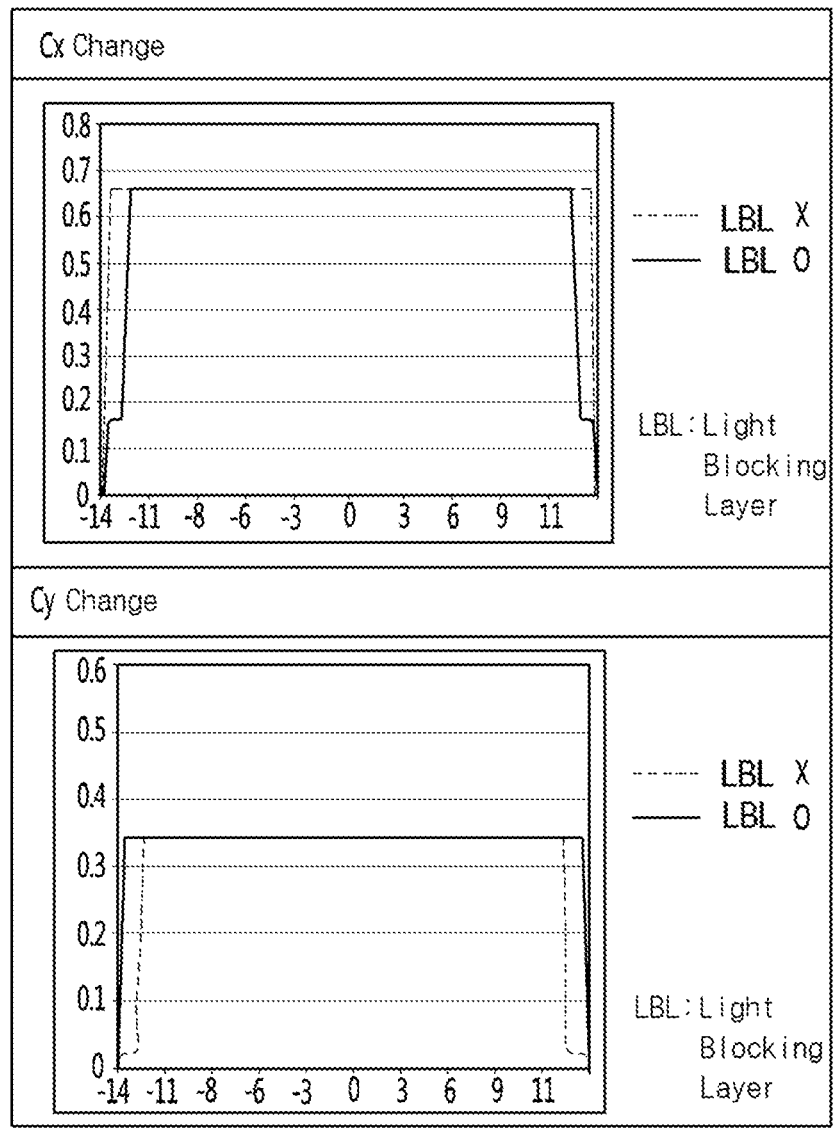
FIG. 14 is a graph showing changes of Cx and Cy in a structure without a light blocking layer in an illumination device and a structure having a light blocking layer of the invention.

Referring to FIG. 14, when there is no light blocking layer and when there is a light blocking layer, there is a mixed region in which the difference in color coordinates in Cx and Cy exists, and it may be seen that unintended colors are emitted therefrom. The illumination device according to the embodiment of the invention has an effect of preventing unwanted light from being emitted by forming a light blocking layer between light of different colors or phosphor layers having different colors.

Figure 15:
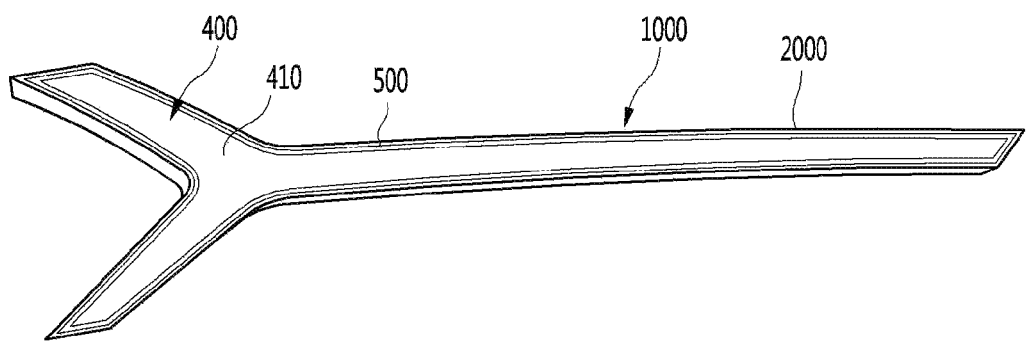
FIG. 15 is a perspective view showing a vehicle lamp using an illumination device according to an embodiment of the invention.

Referring to FIG. 15 is a perspective view showing a vehicle lamp using an illumination device according to an embodiment of the invention. Referring to FIG. 15, a vehicle lamp according to an embodiment of the invention may include an illumination device 1000 and a bezel 2000 surrounding the illumination device 1000. The illumination device 1000 may be formed in a structure in which a plurality of colors is emitted. The illumination apparatus 1000 may include a substrate, a plurality of light emitting devices mounted on the substrate, a resin layer and a phosphor layer 400 disposed on the light emitting devices. The substrate may be formed in a shape having a plurality of protrusions or a plurality of bridge portions. The bridge portion or the protrusions may protrude in different directions. The substrate may be formed to have a curved surface and may be formed of a flexible material so that the substrate may be bent. From this, the degree of freedom of the illumination device may be improved. A light blocking layer 500 may be disposed around the outside of the phosphor layer 400.

The phosphor layer 400 may include a first phosphor layer 410 to emit a first light or a first color on a resin layer, and a second phosphor layer 420 (refer to FIG. 2) disposed on a side surface of the resin layer to emit a second light or a second color. The phosphor layer 400 may selectively apply the configurations of the first and second embodiments disclosed above. The first phosphor layer may display first light or a first color, and the second phosphor layer may serve as an edge around the first phosphor layer. In this case, the light blocking layer 500 may be disposed between the first phosphor layer and the second phosphor layer. In an embodiment of the invention, the light blocking layer 500 may have a structure disposed on a side surface of the first phosphor layer and a side surface of the second phosphor layer. From this, the first color emitted from the first phosphor layer and the second light or second color emitted from the second phosphor layer are not mixed and a desired color may be implemented. For example, the illumination device 1000 according to an exemplary embodiment of the invention may express various colors such as a structure in which light is emitted in a dark red region and a light red region, a structure in which light is emitted in white regions having different color coordinates, or a structure in which light is emitted in a red region and a blue region, etc. The bezel 200 may be open to expose a side surface of the second phosphor layer or may be a transparent material. The bezel 2000 may be formed to surround a side portion of the illumination device 1000. The bezel 2000 may be assembled in a vehicle in a state in which the illumination device 1000 is embedded. In the above, a structure in which the second color generated from the second phosphor is used as a border line of the first color has been described as an example, but the invention is not limited thereto and may be changed to implement an illumination device in various structures.

What is claimed is:

1. An illumination device comprising:
   a substrate;
   a plurality of light emitting devices disposed on the substrate;
   a resin layer surrounding the plurality of light emitting devices;
   a first phosphor layer disposed on an upper surface of the resin layer;
   a second phosphor layer disposed on different side surfaces of the resin layer; and
   a light blocking layer disposed between the first phosphor layer and the second phosphor layer,
   wherein the first phosphor layer and the second phosphor layer have different colors,
   wherein the first phosphor layer overlaps the plurality of light emitting devices in a vertical direction,
   wherein the resin layer is disposed between the plurality of light emitting devices and the first phosphor layer, the resin layer is disposed between side surfaces of the plurality of light emitting devices, and the resin layer is disposed between an outermost light emitting device of the plurality of light emitting devices and the second phosphor layer,
   wherein the light blocking layer is disposed on different side surfaces of the first phosphor layer, and
   wherein the light blocking layer is disposed along an upper surface of the second phosphor layer disposed on each of the different side surfaces of the resin layer,
   wherein the light blocking layer overlaps the resin layer in the vertical direction,
   wherein the light blocking layer is disposed on upper corners of the different side surfaces of the resin layer,
   wherein the light blocking layer overlaps the second phosphor layer in the vertical direction, and
   wherein the light blocking layer is in contact with the different side surfaces of the resin layer.

2. The illumination device of claim 1,
   wherein the light blocking layer includes least one of an uppermost surface of the light blocking layer horizontally aligned with an uppermost surface of the first phosphor layer and an outermost side surface of the light blocking layer vertically aligned with an outermost side surface of the second phosphor layer, and
   wherein the second phosphor layer is disposed higher than upper surfaces of the light emitting devices.

3. The illumination device of claim 1, wherein the light blocking layer includes a silicon material, film, or ink that reflects or absorbs light, and is formed with a constant thickness on the upper surface of the second phosphor layer.

4. The illumination device of claim 1, wherein an outer side surface of the light blocking layer does not protrude from an outer side surface of the second phosphor layer.

5. The illumination device of claim 4, wherein an upper surface of the light blocking layer does not protrude from an upper surface of the first phosphor layer.

6. The illumination device of claim 1, wherein the light blocking layer is in contact with the resin layer and the second phosphor layer, and
   wherein the second phosphor layer is disposed between the light blocking layer and the substrate.

7. The illumination device of claim 6, wherein the light blocking layer is in contact with the first phosphor layer.

8. An illumination device comprising:
   a substrate;
   a plurality of light emitting devices disposed on the substrate;
   a resin layer disposed on the plurality of light emitting devices;
   a first phosphor layer disposed on the resin layer;

a second phosphor layer disposed on different side surfaces of the resin layer; and a light blocking layer disposed between the first phosphor layer and the second phosphor layer, wherein the light blocking layer at least partially overlaps with the second phosphor layer in a vertical direction, and at least partially overlaps the first phosphor layer in a horizontal direction, wherein the first phosphor layer overlaps the plurality of light emitting devices in the vertical direction, wherein the resin layer is disposed between the plurality of light emitting devices and the first phosphor layer, the resin layer is disposed between side surfaces of the plurality of light emitting devices, and the resin layer is disposed between an outermost light emitting device of the plurality of light emitting devices and the second phosphor layer, wherein the light blocking layer is disposed on different side surfaces of the first phosphor layer, and wherein the light blocking layer is disposed along an upper surface of the second phosphor layer disposed on each of the different side surfaces of the resin layer, wherein the light blocking layer overlaps the resin layer in the vertical direction, wherein the light blocking layer is disposed on upper corners of the different side surfaces of the resin layer, and wherein the light blocking layer is in contact with the different side surfaces of the resin layer.

9. The illumination device of claim 8, wherein the second phosphor layer is disposed to surround the resin layer.

10. The illumination device of claim 8, wherein the second phosphor layer is disposed on the substrate.

11. The illumination device of claim 8, wherein the light blocking layer has an open region therein, and wherein the first phosphor layer is disposed in the open region of the light blocking layer.

12. The illumination device of claim 11, wherein the second phosphor layer is disposed between the light blocking layer and the substrate.

13. The illumination device of claim 8, comprising:

a reflective layer disposed between the substrate and the resin layer, wherein the reflective layer is in contact with the resin layer and the second phosphor layer, and wherein the reflective layer does not contact with the first phosphor layer.

14. The illumination device of claim 8, wherein the light blocking layer includes at least one of an uppermost surface of the light blocking layer horizontally aligned with an uppermost surface of the first phosphor layer and an outermost side surface of the light blocking layer vertically aligned with an outermost side surface of the second phosphor layer, and wherein the light blocking layer is disposed on all side surfaces of the first phosphor layer and an entire uppermost surface of the second phosphor layer.

15. The illumination device of claim 8, wherein the first phosphor layer and the second phosphor layer have different colors.

* * * * *